(12) United States Patent
Lo et al.

(10) Patent No.: US 11,843,024 B2
(45) Date of Patent: Dec. 12, 2023

(54) MICRO LED DISPLAY DEVICE AND MANUFACTURING METHOD THEREOF

(71) Applicant: PlayNitride Display Co., Ltd., Miaoli County (TW)

(72) Inventors: Yu-Yun Lo, Miaoli County (TW); Bo-Wei Wu, Miaoli County (TW); Yi-Chun Shih, Miaoli County (TW); Tzu-Yu Ting, Miaoli County (TW); Kuan-Yung Liao, Miaoli County (TW)

(73) Assignee: PlayNitride Display Co., Ltd., Miaoli County (TW)

( * ) Notice: Subject to any disclaimer, the term of this patent is extended or adjusted under 35 U.S.C. 154(b) by 270 days.

(21) Appl. No.: 17/093,588

(22) Filed: Nov. 9, 2020

(65) Prior Publication Data
US 2022/0069000 A1 Mar. 3, 2022

(30) Foreign Application Priority Data
Aug. 31, 2020 (TW) .................................. 109129788

(51) Int. Cl.
*H01L 27/15* (2006.01)
*H01L 33/00* (2010.01)
*H01L 33/48* (2010.01)
*H01L 33/38* (2010.01)

(52) U.S. Cl.
CPC .......... *H01L 27/156* (2013.01); *H01L 33/005* (2013.01); *H01L 33/382* (2013.01); *H01L 33/486* (2013.01)

(58) Field of Classification Search
CPC ... H01L 27/156; H01L 33/005; H01L 33/382; H01L 33/486; H01L 25/0753; H01L 25/167; H01L 33/62
See application file for complete search history.

(56) References Cited

U.S. PATENT DOCUMENTS

| | | | |
|---|---|---|---|
| 9,997,561 B2* | 6/2018 | Cha | H01L 33/507 |
| 2014/0186979 A1* | 7/2014 | Tu | H01L 33/0093 438/27 |
| 2017/0092820 A1* | 3/2017 | Kim | H01L 25/0753 |

(Continued)

FOREIGN PATENT DOCUMENTS

| TW | 201507212 A | 2/2015 |
|---|---|---|
| TW | I682436 B | 1/2020 |

*Primary Examiner* — Su C Kim
(74) *Attorney, Agent, or Firm* — CKC & Partners Co., LLC

(57) ABSTRACT

A micro LED display device includes a micro light emitting unit, a conductive structure and a substrate. The micro light emitting unit includes a plurality of micro light emitting elements, and each of the micro light emitting elements includes a semiconductor structure and an electrode structure. The semiconductor structure includes a first type semiconductor layer, a light emitting layer and a second type semiconductor layer. The electrode structure includes a first type electrode and a second type electrode. The conductive structure includes a first type conductive layer and a second type conductive layer. The first type conductive layer is electrically connected to the first type electrode, and the second type conductive layer is electrically connected to the second type electrode. The micro light emitting unit is disposed on the substrate, and the electrode structure is disposed toward the substrate and includes a gap therebetween.

17 Claims, 17 Drawing Sheets

(56) References Cited

U.S. PATENT DOCUMENTS

2017/0250316 A1\* 8/2017 Yeon ................... H01L 33/504
2018/0175261 A1\* 6/2018 Yoo ..................... H01L 33/46
2020/0152827 A1   5/2020 Chen et al.

\* cited by examiner

US 11,843,024 B2

MICRO LED DISPLAY DEVICE AND MANUFACTURING METHOD THEREOF

RELATED APPLICATIONS

This application claims priority to Taiwan Application Serial Number 109129788, filed Aug. 31, 2020, which is herein incorporated by reference.

BACKGROUND

Technical Field

The present disclosure relates to a display device and a manufacturing method thereof. More particularly, the present disclosure relates to a micro LED display device and a manufacturing method thereof.

Description of Related Art

Due to the development of display device technology, the micro LED display has gradually become a current dominant trend, and the micro LED display is the research and development key. However, there is still some technical problem in the manufacturing process of the micro LED display.

The manufacturing process need to transfer a significant amount of micro LED from a wafer to a panel. Part of the micro LED may fall or cannot dispose on the panel accurately. Therefore, there is an urgent need for a solution of a micro LED display device and the manufacturing method which is featured with accurately positioning, reducing the damage rate of the micro LED, in today's market.

SUMMARY

According to one embodiment of the present disclosure, a micro LED display device includes a micro light emitting unit, a conductive structure and a substrate. The micro light emitting unit includes a plurality of micro light emitting elements. Each of the micro light emitting elements includes a semiconductor structure and an electrode structure. The semiconductor structure includes a first type semiconductor layer, a light emitting layer and a second type semiconductor layer. The electrode structure includes a first type electrode and a second type electrode, and each of the first type electrode and the second type electrode is electrically connected to the first type semiconductor layer and the second type semiconductor layer. The conductive structure includes a first type conductive layer and a second type conductive layer, the first type conductive layer is electrically connected to the first type electrode, and the second type conductive layer is electrically connected to the second type electrode. The micro light emitting unit is disposed on the substrate, and the electrode structure is disposed toward the substrate and includes a gap therebetween.

According to another embodiment of the present disclosure, a manufacturing method of a micro LED display device includes steps as follow. A conductive structure disposing step and a substrate disposing step are performed. In the conductive structure disposing step, a conductive structure is disposed on a plurality of micro light emitting elements of a micro light emitting unit. In the substrate disposing step, the micro light emitting unit is disposed on a substrate. The micro light emitting unit is formed by the micro light emitting elements and the conductive structure, and the substrate is disposed toward an electrode structure of each of the micro light emitting elements and includes a gap therebetween.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiments, the practical details is unnecessary. In addition, for simplifying the drawings, some conventional structures and elements will be simply illustrated, and repeated elements may be represented by the same labels.

Figure 1:
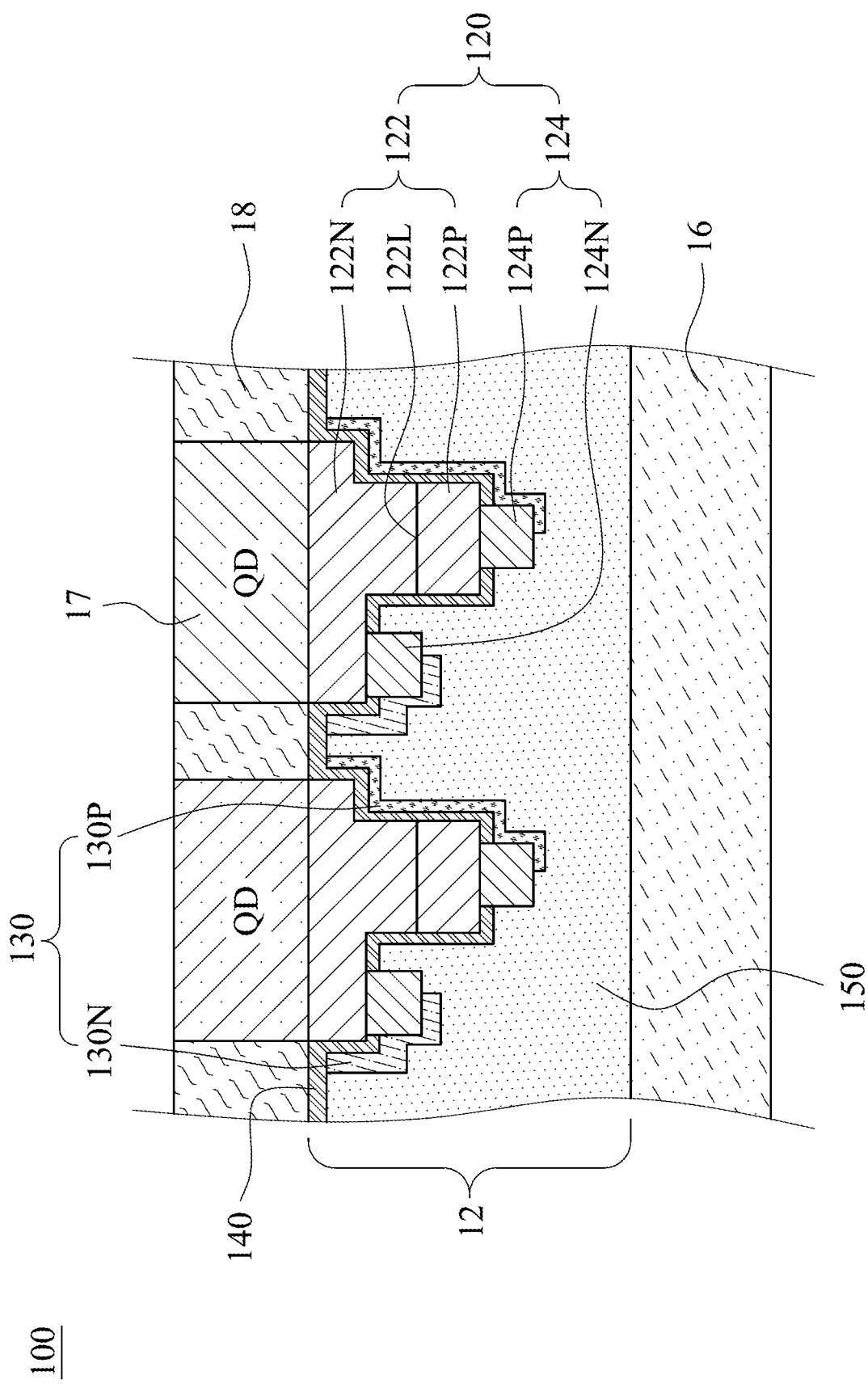
FIG. 1 is a schematic view of a structure of a micro LED display device according to a first embodiment of the present disclosure.

FIG. 1 is a schematic view of a structure of a micro LED display device 100 according to a first embodiment of the present disclosure. The micro LED display device 100 includes a micro light emitting unit 12, a conductive structure 130, a substrate 16, a color conversion layer 17, a light shielding layer 18 and an isolation layer 150. The micro light emitting unit 12 includes a plurality of micro light emitting elements 120 and an insulation layer 140. Each of the micro light emitting elements 120 includes a semiconductor structure 122 and an electrode structure 124. The semiconductor structure 122 includes a first type semiconductor layer 122P, a light emitting layer 122L and a second type semiconductor layer 122N, and the light emitting layer 122L is disposed between the first type semiconductor layer 122P and the second type semiconductor layer 122N. The electrode structure 124 includes a first type electrode 124P and a second type electrode 124N. The first type electrode 124P and the second type electrode 124N are electrically connected to the first type semiconductor layer 122P and the second type semiconductor layer 122N, respectively. The conductive structure 130 includes a first type conductive layer 130P and the second type conductive layer 130N. The first type conductive layer 130P is electrically connected to the first type electrode 124P, and the second type conductive layer 130N is electrically connected to the second type electrode 124N. The insulation layer 140 is disposed between the conductive structure 130 and the semiconductor structure 122, and configured to insulate the conductive structure 130 and the semiconductor structure 122. The isolation layer 150 is connected between the conductive structure 130 and the substrate 16, and configured to isolate the conductive structure 130 and the substrate 16. The micro light emitting unit 12 is disposed on the substrate 16 via the isolation layer 150. The substrate 16 is disposed toward the electrode structures 124 of the micro light emitting elements 120, and includes a gap therebetween. In other words, the electrode structure 124 of the micro light emitting elements 120 does not contact the substrate 16 directly. The isolation layer 150 is connected between the conductive structure 130 and the substrate 16, and configured to isolate the conductive structure 130 and the substrate 16. The color conversion layer 17 is disposed on a side of the micro light emitting unit 12 which is far away from the substrate 16, and configured to convert a color of a light of each of the micro light emitting elements 120. Thus, the micro LED display device 100 of the present disclosure fixes the micro light emitting elements 120 with each other via the insulation layer 140, and disposes the conductive structure 130 on the micro light emitting elements 120 before the mass transfer process, and configures the isolation layer 150 as a buffer to reduce the damage rate of the micro light emitting elements 120 during the mass transfer process. Moreover, the micro light emitting elements 120 of the present disclosure can be a flip-chip light emitting element.

Figure 2:
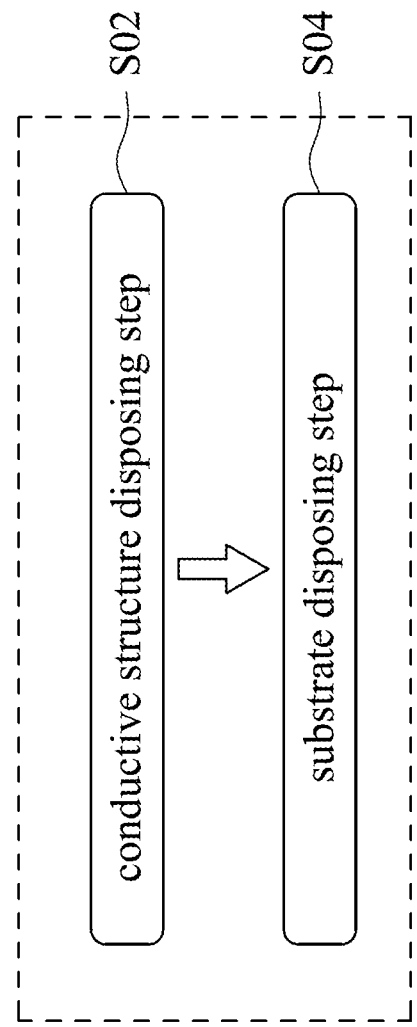
FIG. 2 is a flow chart of a manufacturing method of a micro LED display device according to a second embodiment of the present disclosure.

FIG. 2 is a flow chart of a manufacturing method 200 of the micro LED display device 100 according to a second embodiment of the present disclosure. In FIG. 1 and FIG. 2, the manufacturing method 200 of the micro LED display device 100 includes a conductive structure disposing step S02 and a substrate disposing step S04. The conductive structure disposing step S02 is performed to dispose a conductive structure 130 on the micro light emitting elements 120 of the micro light emitting unit 12. The substrate disposing step S04 is performed to dispose the micro light emitting unit 12 on a substrate 16. The micro light emitting unit 12 is formed by the micro light emitting elements 120 and the conductive structure 130, and the substrate 16 is disposed toward the electrode structure 124. Thus, the micro LED display device 100 of the present disclosure disposes the conductive structure 130 on the micro light emitting elements 120 before the micro light emitting elements 120 is disposed on the substrate 16. The conductive structure 130 is electrically connected to a working circuit 167 (in FIG. 7A) and electrically connected to an external control device 165 (in FIG. 7A) via a connector 166 (in FIG. 7A) to control the display device, and the problem wherein the micro light emitting elements 120 and the conductive structure 130 cannot be positioning accurately during the mass transfer process can be avoided. The details of the aforementioned step will be described below.

Figure 3:
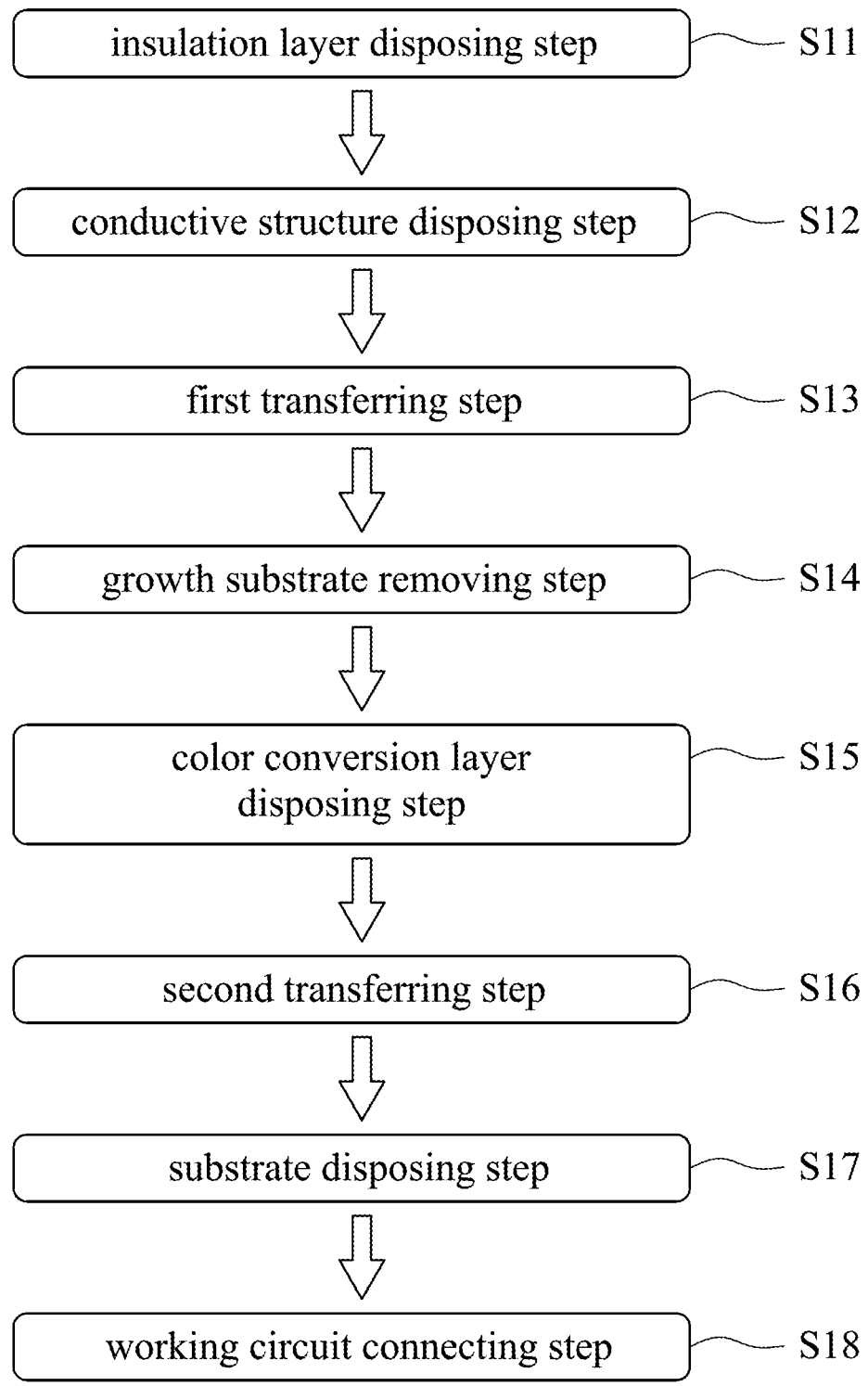
FIG. 3 is a flow chart of a manufacturing method of a micro LED display device according to a third embodiment of the present disclosure.

FIG. 3 is a flow chart of a manufacturing method 200a of the micro LED display device 100 according to a third embodiment of the present disclosure. In FIG. 1 and FIG. 3, the manufacturing method 200a includes an insulation layer disposing step S11, a conductive structure disposing step S12, a first transferring step S13, a growth substrate removing step S14, a color conversion layer disposing step S15, a second transferring step S16, a substrate disposing step S17 and a working circuit connecting step S18 in sequence. The steps will be described below by the corresponded schematic view of the structure of each of the steps.

Figure 4A:
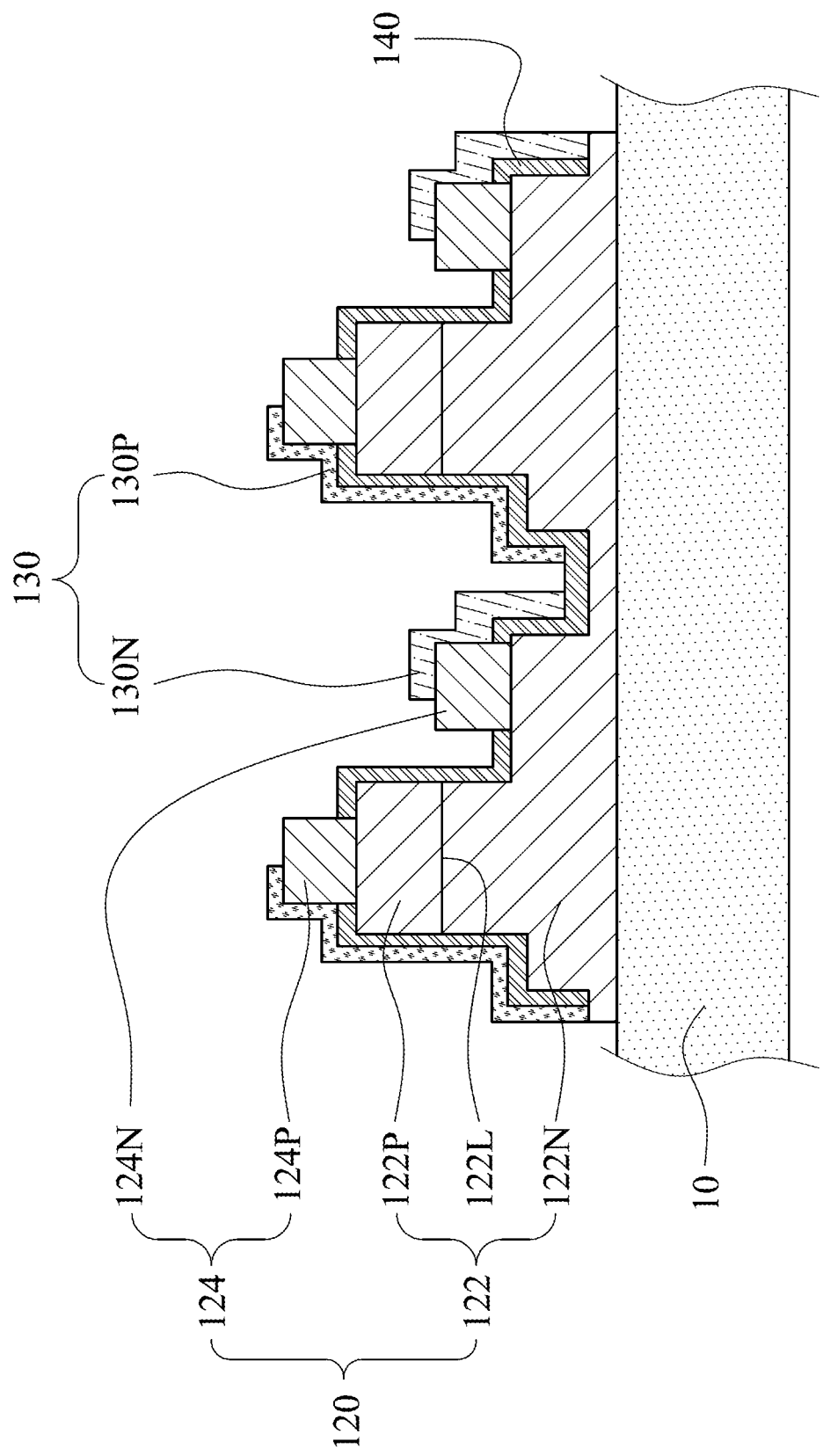
FIG. 4A is a schematic view of a structure of an insulation layer disposing step and a conductive structure disposing step of the manufacturing method of the micro LED display device of FIG. 3.

FIG. 4A is a schematic view of a structure of an insulation layer disposing step S11 and a conductive structure disposing step S12 of the manufacturing method 200a of the micro LED display device 100 of FIG. 3. In FIG. 3 and FIG. 4A, the insulation layer disposing step S11 is performed to dispose the insulation layer 140 between the semiconductor structure 122 of each of the micro light emitting elements 120 and the conductive structure 130 when the semiconductor structure 122 is disposed on the growth substrate 10. The conductive structure disposing step S12 is performed to dispose the conductive structure 130 on the micro light emitting elements 120 of the micro light emitting unit 12. In detail, the insulation layer disposing step S11 is performed to dispose the insulation layer 140 on a surface of the semiconductor structure 122, so the micro light emitting elements can fix with each other via the insulation layer 140. The conductive structure disposing step S12 is performed to dispose the first type conductive layer 130P on the first type electrode 124P, and dispose the second type conductive layer 130N on the second type electrode 124N. In the third embodiment of the present disclosure, the growth substrate 10 can be the growth substrate 10 of the micro light emitting elements 120 of the micro light emitting unit 12, such as a sapphire substrate or a silicon substrate. The semiconductor structure 122 can be formed by the III-V semiconductor, such as GaN. The first type electrode 124P can be a p electrode, and the second type electrode 124N can be an n electrode, but the present disclosure is not limited thereto. Thus, the micro light emitting elements 120 of the present disclosure are fixed with each other via the insulation layer 140 to reduce the damage rate and the displacement of the micro light emitting elements 120 during the mass transfer process.

Figure 4B:
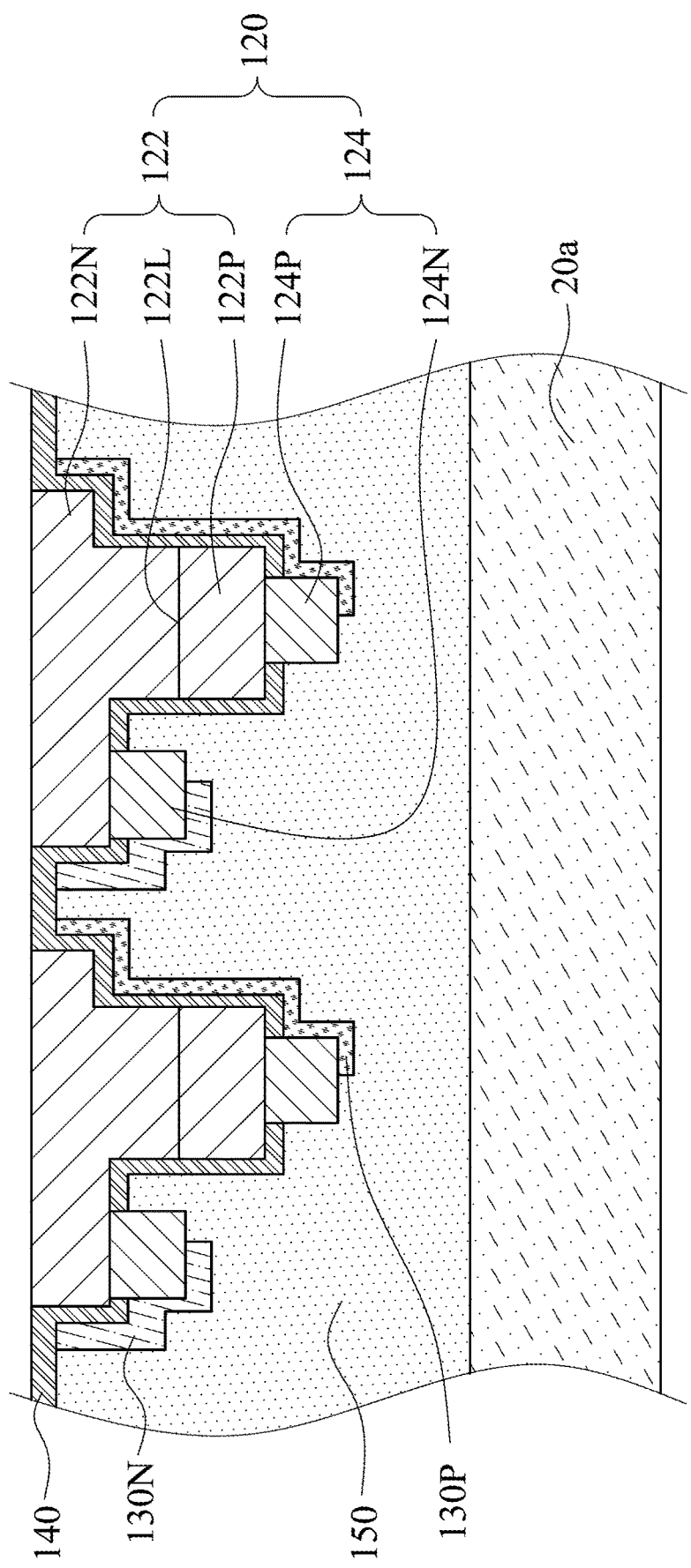
FIG. 4B is a schematic view of a structure of a first transferring step and a growth substrate removing step of the manufacturing method of the micro LED display device of FIG. 3.

FIG. 4B is a schematic view of a structure of a first transferring step S13 and a growth substrate removing step S14 of the manufacturing method 200a of the micro LED display device 100 of FIG. 3. In FIG. 3 and FIG. 4B, the first transferring step S13 is performed to transfer the micro light emitting unit 12 on a first temporary substrate 20a via an isolation layer 150. The isolation layer 150 can be an adhesiveness organic polymer material, such as epoxy, but the present disclosure is not limited thereto. The growth substrate removing step S14 is performed to remove the growth substrate 10 (in FIG. 4A) of the micro light emitting unit 12 from the micro light emitting elements 120. In detail, the growth substrate removing step S14 is configured to remove a part of the second type semiconductor layer 122N connected between each of the micro light emitting elements 120. In other embodiments, the insulation layer 140 can be disposed on the micro light emitting elements 120 after removing the part of the second type semiconductor layer 122N connected between each of the micro light emitting elements 120, and then removing the growth substrate 10.

Figure 4C:
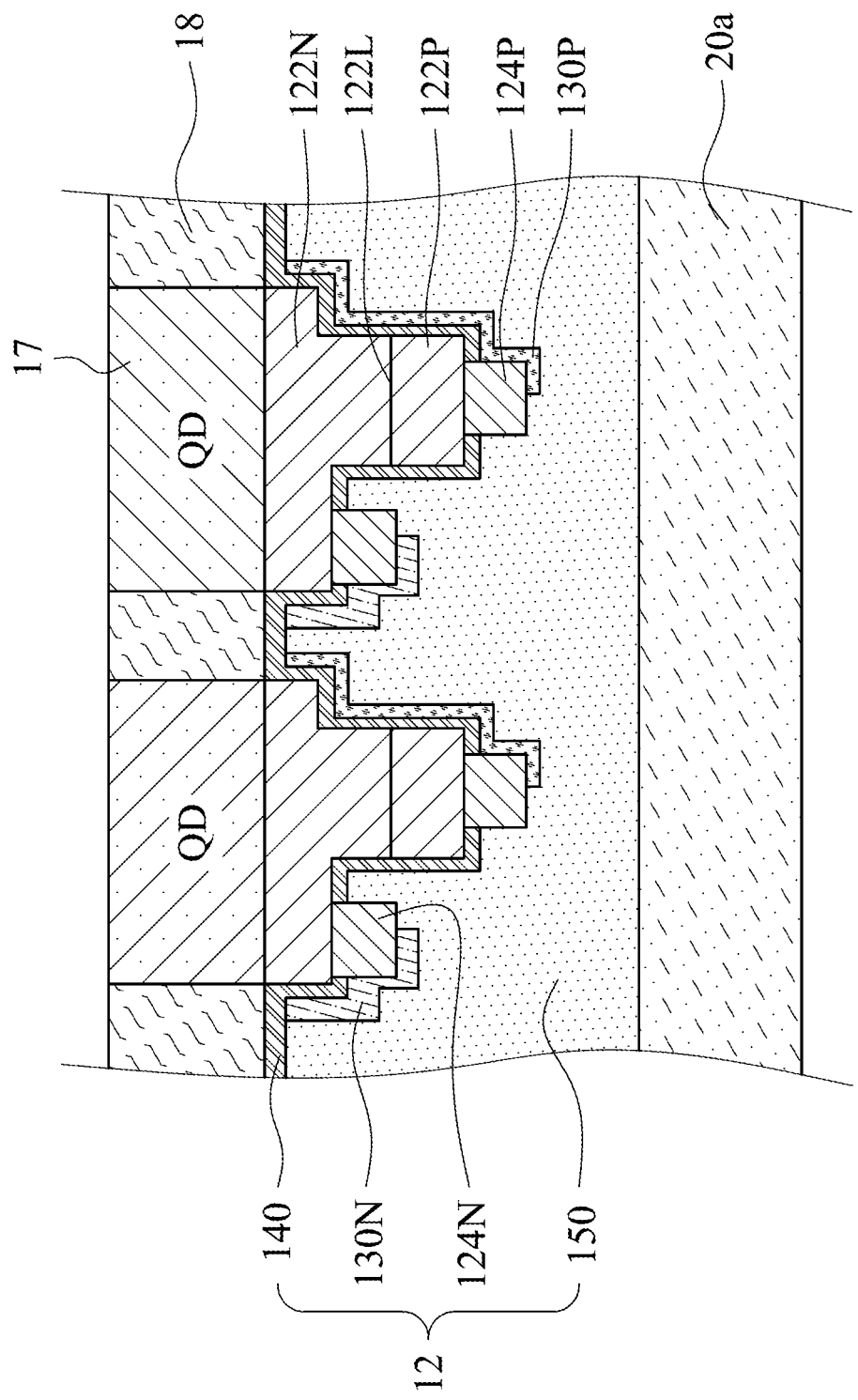
FIG. 4C is a schematic view of a structure of a color conversion layer disposing step of the manufacturing method of the micro LED display device of FIG. 3.

FIG. 4C is a schematic view of a structure of a color conversion layer disposing step S15 of the manufacturing method 200a of the micro LED display device 100 of FIG. 3. In FIG. 3 and FIG. 4C, the color conversion layer disposing step S15 is performed to dispose the color conversion layer 17 on a side of the micro light emitting unit 12, that is, the side of the micro light emitting unit 12 is adjacent to the second type semiconductor layer 122N. The light shielding layer 18 is disposed between the color conversion layer 17 to avoid the interference formed by each of the micro light emitting elements 120, while converting the light via the color conversion layer 17, and the efficiency of the color conversion can be increased. Moreover, in other embodiments, the color conversion layer disposed on the micro light emitting elements can be omitted optionally, such as a display device with single color.

Figure 4D:
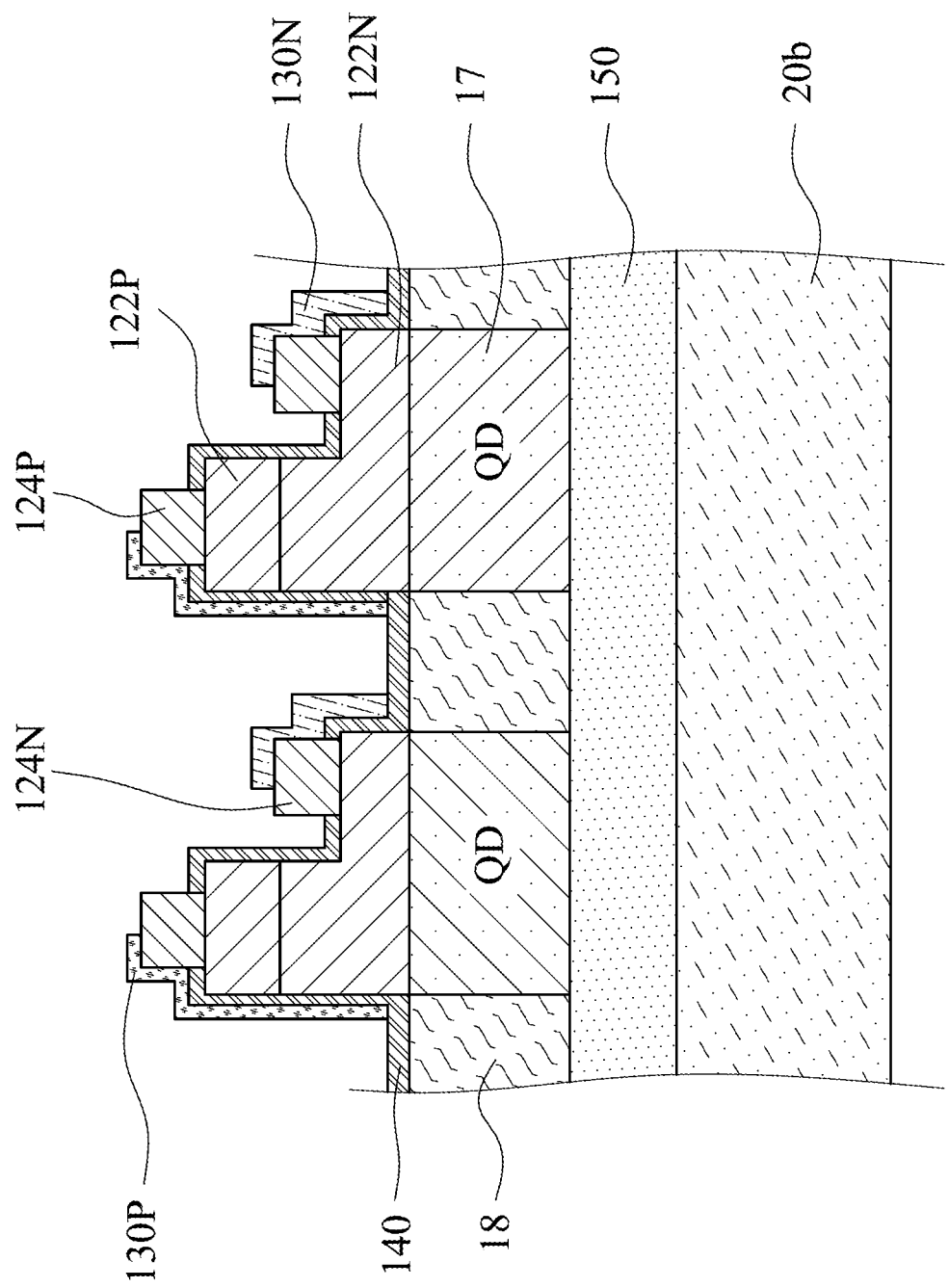
FIG. 4D is a schematic view of a structure of a second transferring step of the manufacturing method of the micro LED display device of FIG. 3.

FIG. 4D is a schematic view of a structure of a second transferring step S16 of the manufacturing method 200a of the micro LED display device 100 of FIG. 3. In FIG. 3 and FIG. 4D, the second transferring step S16 is performed to connect the color conversion layer 17 with a second temporary substrate 20b via the isolation layer 150 and remove the first temporary substrate 20a (as shown in FIG. 4C) from the micro light emitting elements 120. In other words, the second transferring step S16 transfers the micro light emitting elements 120 on the second temporary substrate 20b.

Figure 4E:
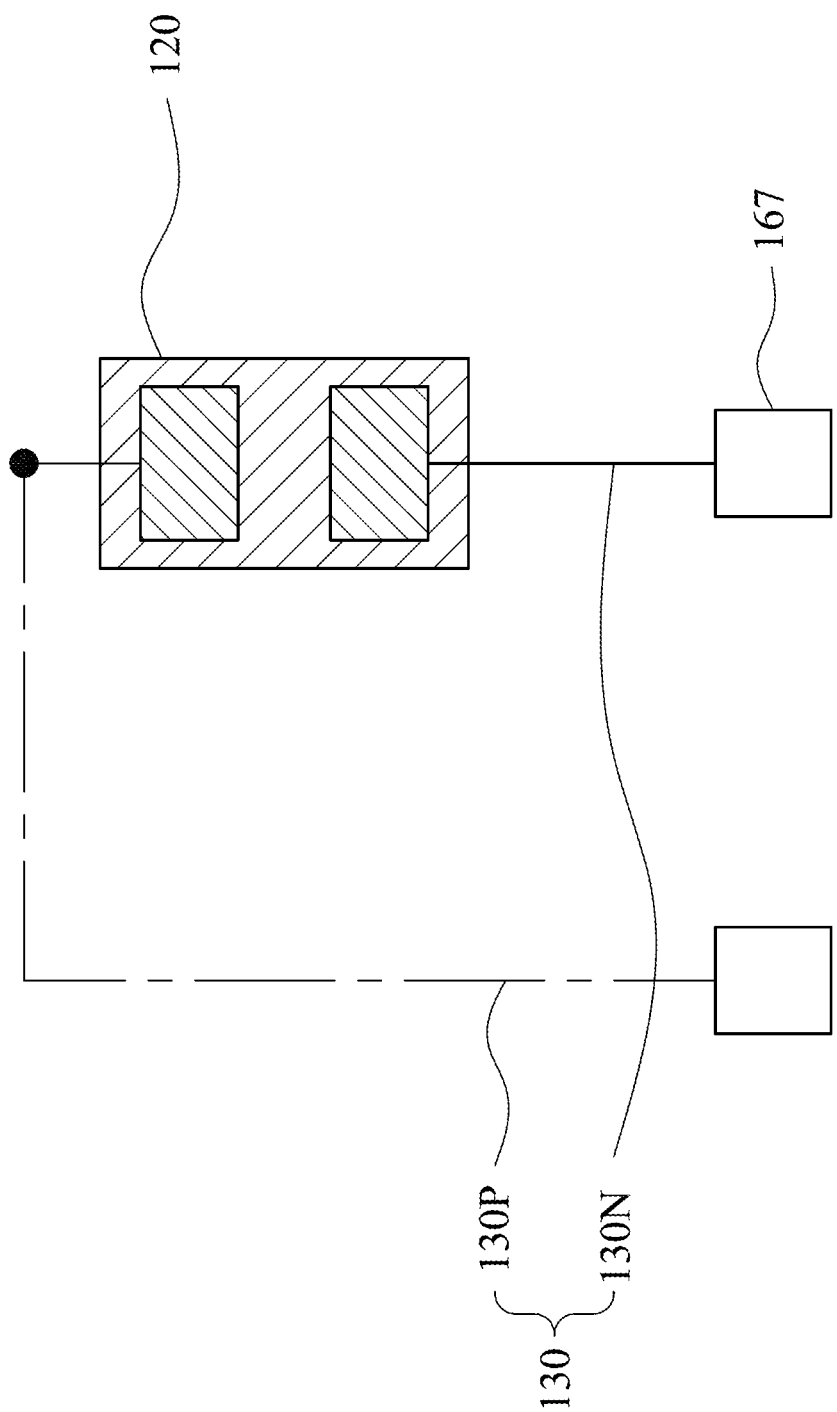
FIG. 4E is a schematic view of a structure of a substrate disposing step and a working circuit connecting step of the manufacturing method of the micro LED display device of FIG. 3.

FIG. 4E is a schematic view of a structure of a substrate disposing step S17 and a working circuit connecting step S18 of the manufacturing method 200a of the micro LED display device 100 of FIG. 3. The substrate disposing step S17 is performed to dispose the micro light emitting unit 12 on the substrate 16 by connecting with the isolation layer 150, and remove the second temporary substrate 20b (as shown in FIG. 4D). The working circuit connecting step S18 is performed to electrically connect the working circuit 167 of the substrate 16 to the conductive structure 130. In other words, each of the micro light emitting elements 120 is electrically connected to the working circuit 167 via the first type conductive layer 130P and the second type conductive layer 130N. The structure of the micro LED display device 100 in FIG. 1 of the present disclosure can be obtained after the working circuit connecting step S18. By the aforementioned two transferring steps, the connection force between the micro light emitting unit 12 and each of the first temporary substrate 20a (as shown in FIG. 4C) and the connection force between the micro light emitting unit 12 and the second temporary substrate 20b can be reduced, so the yield of the micro light emitting unit 12 transferring to the destination substrate can be increased. In other embodiments, the times of the transferring step can be reduced.

Figure 5:
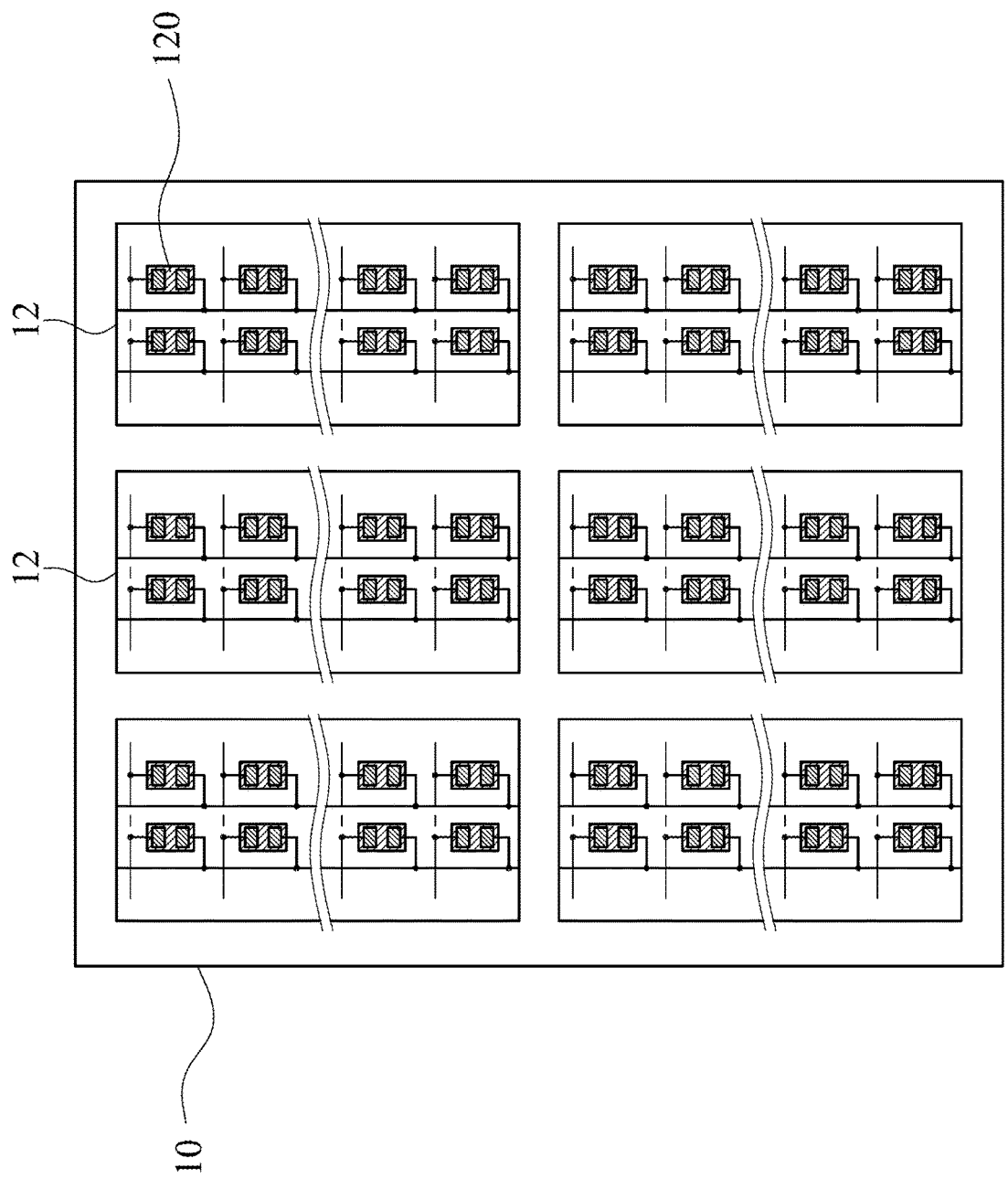
FIG. 5 is a schematic view of a structure of an area defining step of the manufacturing method of the micro LED display device of FIG. 3.

FIG. 5 is a schematic view of a structure of an area defining step of the manufacturing method 200a of the micro LED display device 100 of FIG. 3. In FIG. 3 and FIG. 5, the manufacturing method 200a of the micro LED display device 100 of the present disclosure further includes an area dividing step (not shown in drawings). Before the insulation layer disposing step S11 is performed, the area dividing step is performed to define a plurality of micro light emitting units 12 on the growth substrate 10 as an area to transfer each time, transfer to a substrate (not shown in drawings) with a corresponding size, and form a micro LED display device 100. Each of the micro light emitting units 12 includes a plurality of micro light emitting elements 120. Furthermore, the insulation layers (not shown in drawings) of the micro light emitting units 12 do not connect with each other, but the micro light emitting elements 120 of each of the micro light emitting units 12 are connected with each other via the insulation layer. In other embodiments of the present disclosure, a 6-inch LED wafer can be defined into the micro light emitting units 12, where each of the micro light emitting units 12 is expected to display in 1-inch, and transfer to a display substrate with a display area in 1-inch to form a micro LED display device. The micro LED display device formed by the area defining step can be optionally spliced to another micro LED display device with different sizes. For example, a plurality of 1-inch micro LED display devices can be spliced into a micro LED display device with a bigger size.

Figure 6:
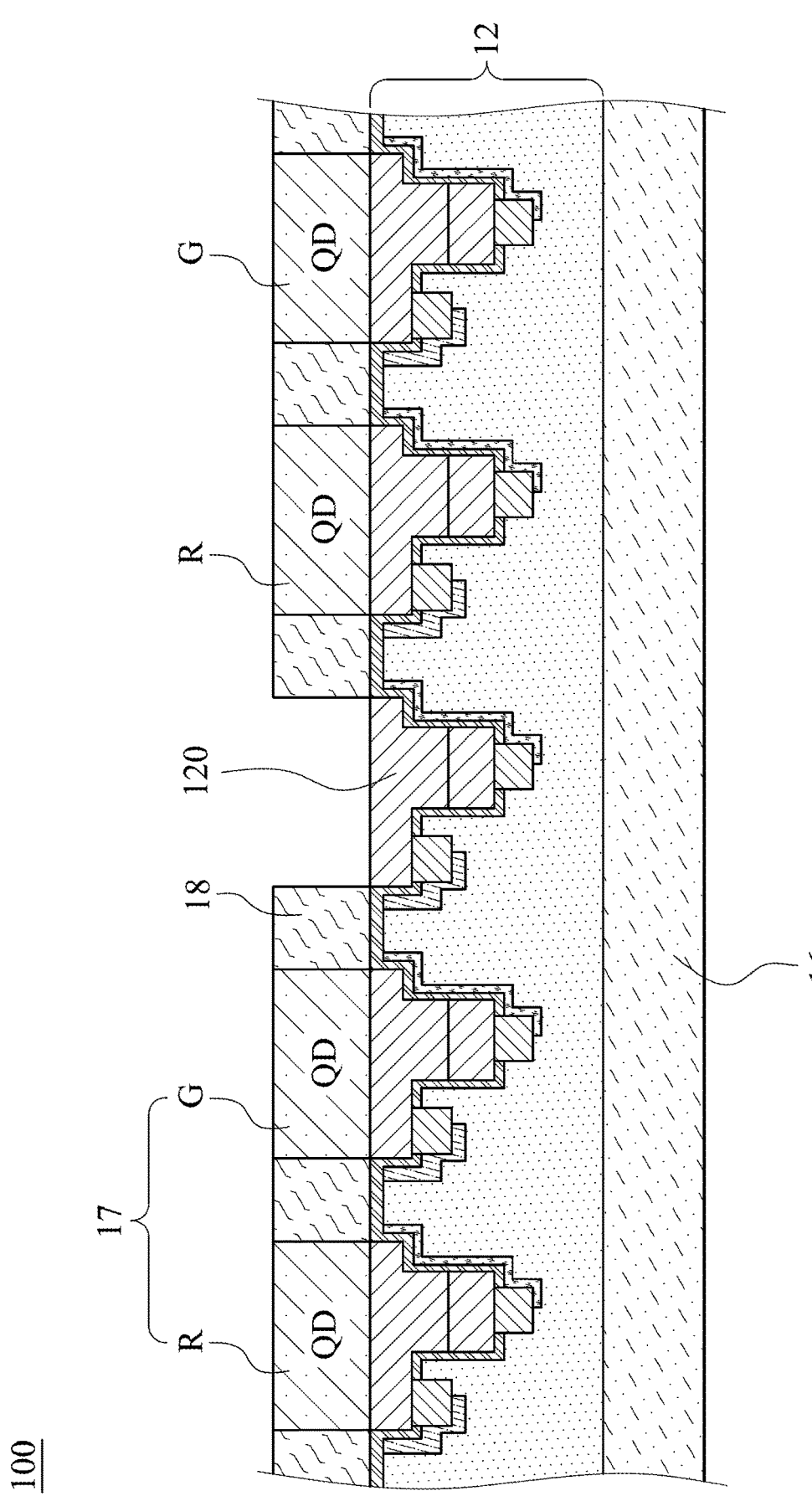
FIG. 6 is a schematic view of a color conversion layer of the micro LED display device of FIG. 1.

FIG. 6 is a schematic view of the color conversion layer 17 of the micro LED display device 100 of FIG. 1. The color conversion layer 17 includes a plurality of red quantum dots R and a plurality of green quantum dots G. One of the red quantum dots R and one of the green quantum dots G are disposed on each of the micro light emitting elements 120 in sequence. After jumping over a micro light emitting element 120, another of the red quantum dots R and another of the green quantum dots G are disposed on each of the micro light emitting elements 120 in sequence. The top of the micro light emitting element 120 which is jumped over can be a void space or a transparent material which can be filled in. Thus, the micro LED display device 100 of the present disclosure disposes the color conversion layer 17 on the micro light emitting elements 120, which can emit blue light, to emit red, green and blue light, and avoid a problem of a conventional technique of transferring LED wafer with three colors, respectively. Moreover, the substrate 16 is a display substrate with circuit, such as complementary metal-oxide-semiconductor (CMOS), printed circuit board (PCB), liquid crystal on silicon (LCoS), thin-film transistor (TFT) or other substrate with working circuit.

Figure 7A:
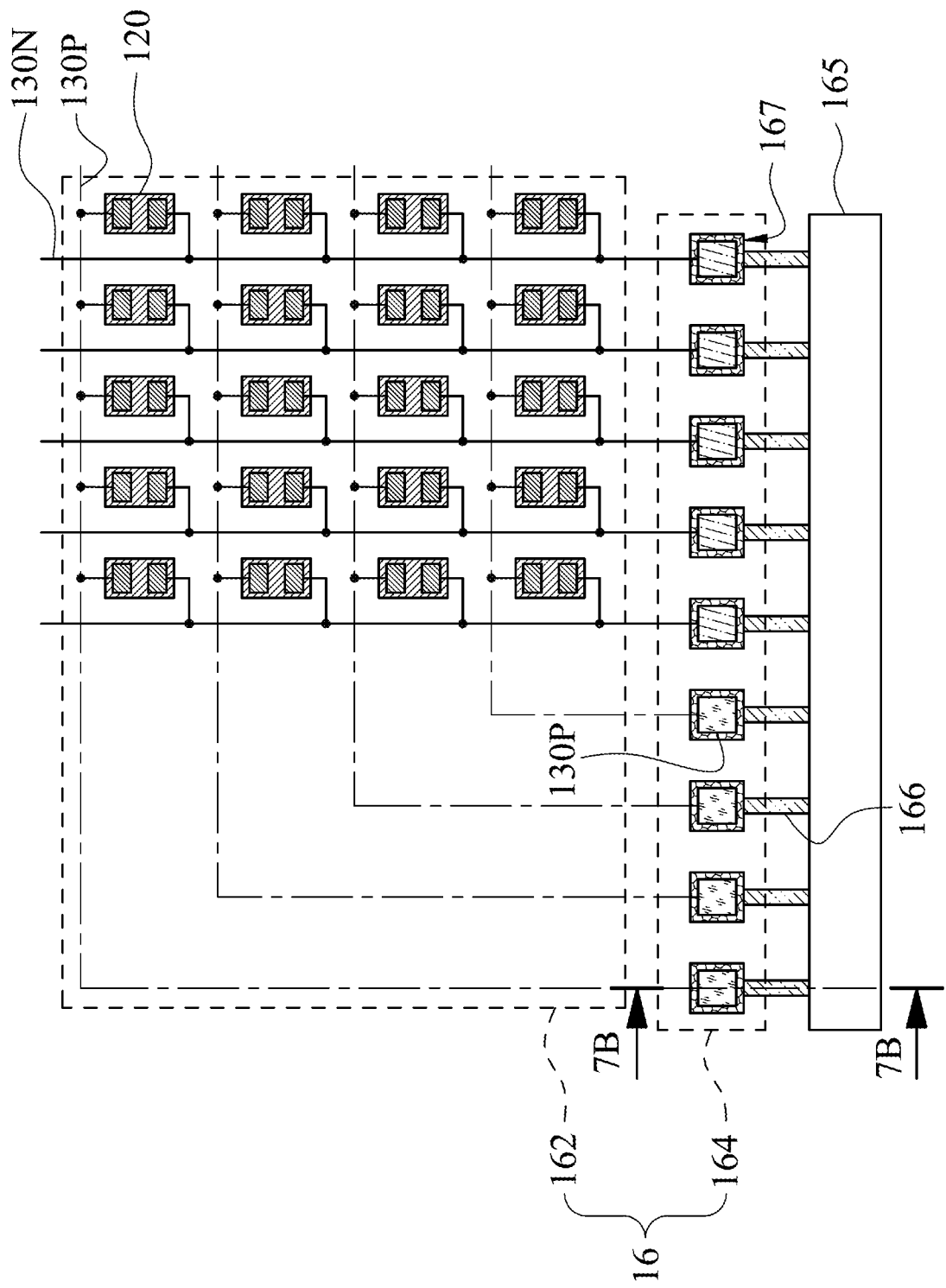
FIG. 7A is a schematic view of a connecting structure of a substrate of the micro LED display device of FIG. 1.
Figure 7B:
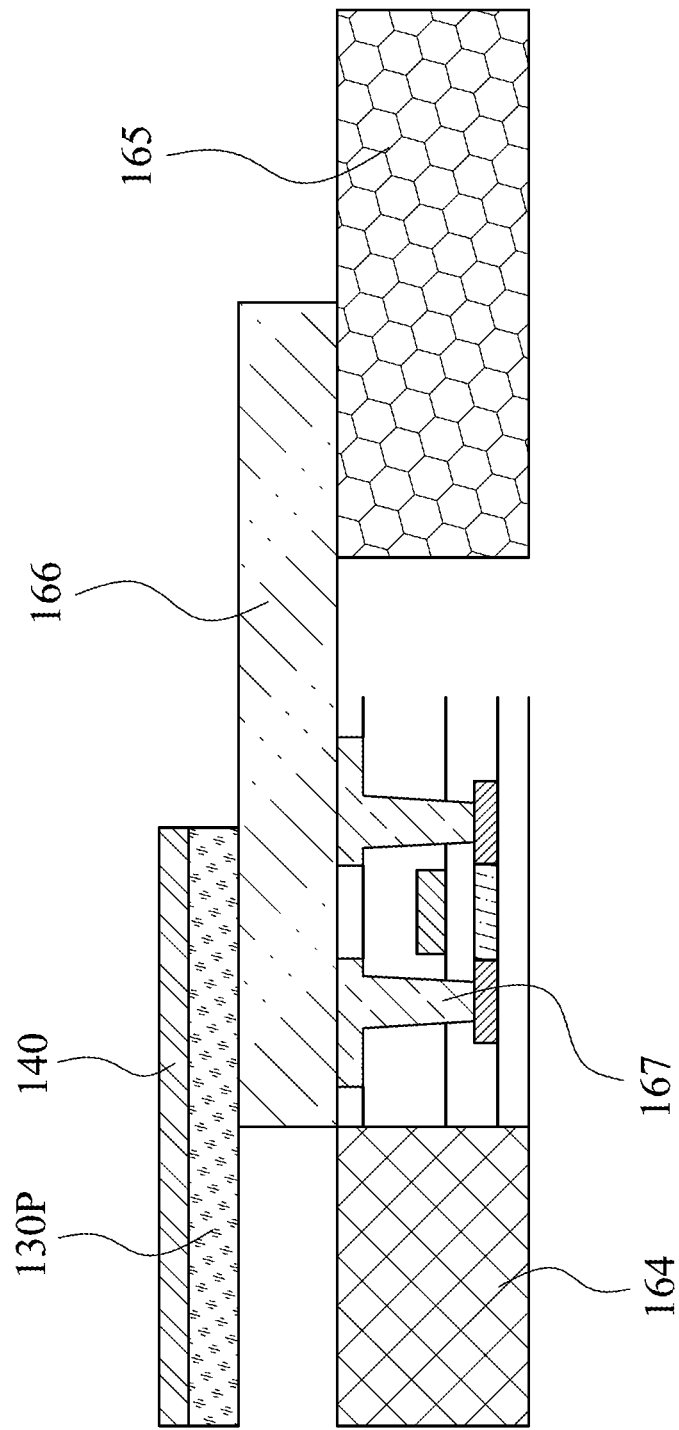
FIG. 7B is a cross-sectional view along line 7B-7B of FIG. 7A.

FIG. 7A is a schematic view of a connecting structure of the substrate 16 of the micro LED display device 100 of FIG. 1. FIG. 7B is a cross-sectional view along line 7B-7B of FIG. 7A. The substrate 16 is a display substrate, and the display substrate includes a display area 162 and a non-display area 164. The display area 162 is disposed on another side of the micro light emitting unit 12. The micro light emitting elements 120 disposed on the display area 162 to implement the display function. The non-display area 164 includes a connector 166 and a working circuit 167. The working circuit 167 is electrically connected to a control device 165 via the connector 166. The micro light emitting elements 120 are arranged in a matrix. The matrix includes a plurality of columns and a plurality of rows. Each of the columns is perpendicular to each of the rows. The first type electrodes 124P of a part of the micro light emitting elements 120 in the columns are electrically connected to the first type conductive layer 130P. The second type electrodes 124N of a part of the micro light emitting elements arranged in the rows are electrically connected to the second type conductive layer 130N. In detail, the micro light emitting elements 120 are arranged in the display area 162 in a matrix form. The first type electrodes 124P of the micro light emitting elements 120 in each of the columns are connected to each other by the first type conductive layer 130P, and connect to the working circuit 167 which is disposed on the non-display area 164. The second type electrodes 124N of the micro light emitting elements 120 in each of the rows are connected to each other by the second type conductive layer 130N, and connect to the working circuit 167 which is disposed on the non-display area 164. The working circuit 167 can be a TFT working circuit to control and drive the micro light emitting elements 120. In detail, the driving mode of the micro LED display device 100 of the present disclosure is passive matrix (PM). The working circuit 167 is electrically connected to the external control device 165 via the connector 166 to control the display of the display device. The connector 166 can be a flexible printed circuit (FPC), but the present disclosure is not limited thereto. Thus, the manufacturing method 200a of the micro LED display device 100 of the present disclosure disposes the conductive structure 130 on the micro light emitting elements 120 before transferring the micro light emitting elements 120 to avoid the problem of the micro light emitting elements 120 and the conductive structure 130 cannot be positioning accurately during the mass transfer process.

Figure 8:
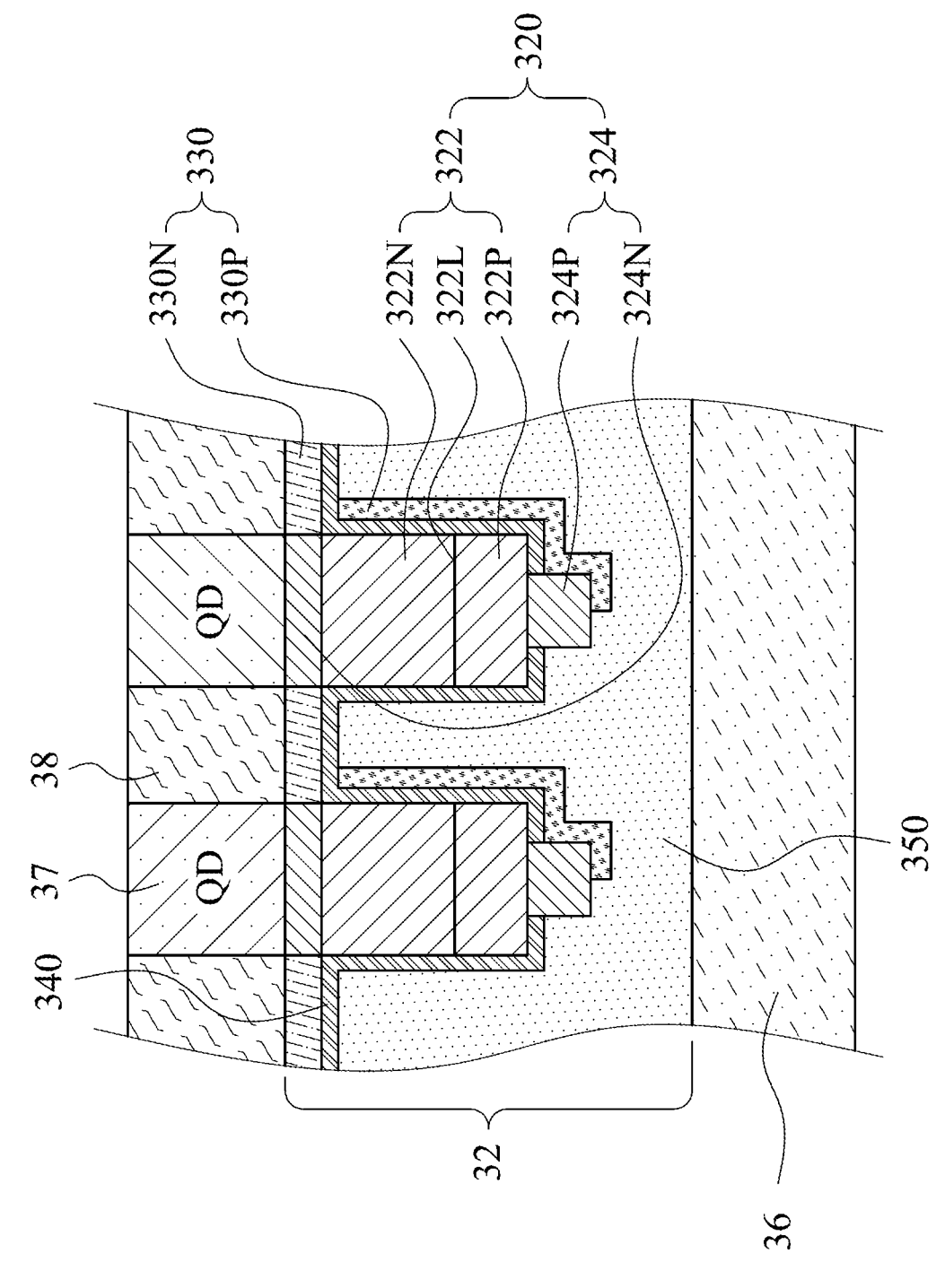
FIG. 8 is a schematic view of a structure of a micro LED display device according to a fourth embodiment of the present disclosure.

FIG. 8 is a schematic view of a structure of the micro LED display device 300 according to a fourth embodiment of the present disclosure. The micro LED display device 300 includes a micro light emitting unit 32, a conductive structure 330, a substrate 36, a color conversion layer 37, a light shielding layer 38 and an isolation layer 350. The micro light emitting unit 32 includes a plurality of light emitting elements 320 and an insulation layer 340. Each of the micro light emitting elements 320 includes a semiconductor structure 322 and an electrode structure 324. The semiconductor structure 322 includes a first type semiconductor layer 322P, a light emitting layer 322L and a second type semiconductor layer 322N. The electrode structure 324 includes a first type electrode 324P and a second type electrode 324N. The conductive structure 330 includes a first type conductive layer 330P and a second type conductive layer 330N. In the present embodiment, the structures of the micro light emitting unit 32, the substrate 36, the color conversion layer 37, the light shielding layer 38, the micro light emitting elements 320, the conductive structure 330, the insulation layer 340, the isolation layer 350, the first type semiconductor layer 322P and the second type semiconductor layer 322N of the micro LED display device 300 are similar to the structures of the micro light emitting unit 12, the substrate 16, the color conversion layer 17, the light shielding layer 18, the micro light emitting elements 120, the conductive structure 130, the insulation layer 140, the isolation layer 150, the first type semiconductor layer 122P and the second type semiconductor layer 122N of the aforementioned first embodiment, and will not be described in the fourth embodiment again. Furthermore, the second type electrode 324N of the micro LED display device 300 is disposed on a side of the semiconductor structure 322 which is opposite to the first type electrode 324P, the second type conductive layer 330N is disposed between the second type electrodes 324N, and the micro light emitting elements 320 are vertical light emitting elements.

Figure 9:
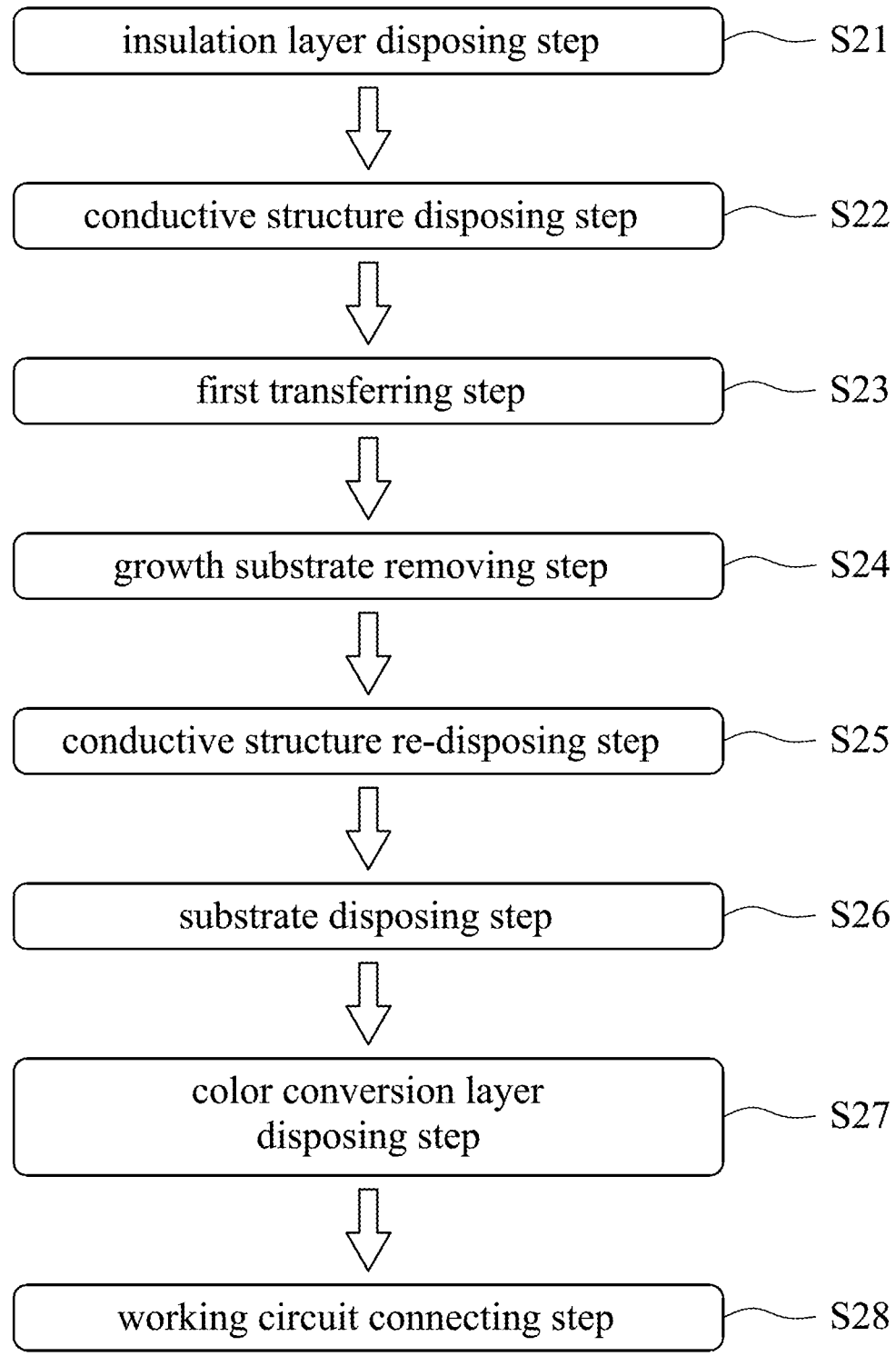
FIG. 9 is a flow chart of a manufacturing method of the micro LED display device of FIG. 8.

FIG. 9 is a flow chart of a manufacturing method 400 of the micro LED display device 300 of FIG. 8. In FIG. 9, the manufacturing method 400 of the micro LED display device 300 includes an insulation layer disposing step S21, a conductive structure disposing step S22, a first transferring step S23, a growth substrate removing step S24, a conductive structure re-disposing step S25, a substrate disposing step S26, a color conversion layer disposing step S27 and a working circuit connecting step S28. The step will be described below by the corresponded schematic view of the structure of each of the steps.

Figure 10A:
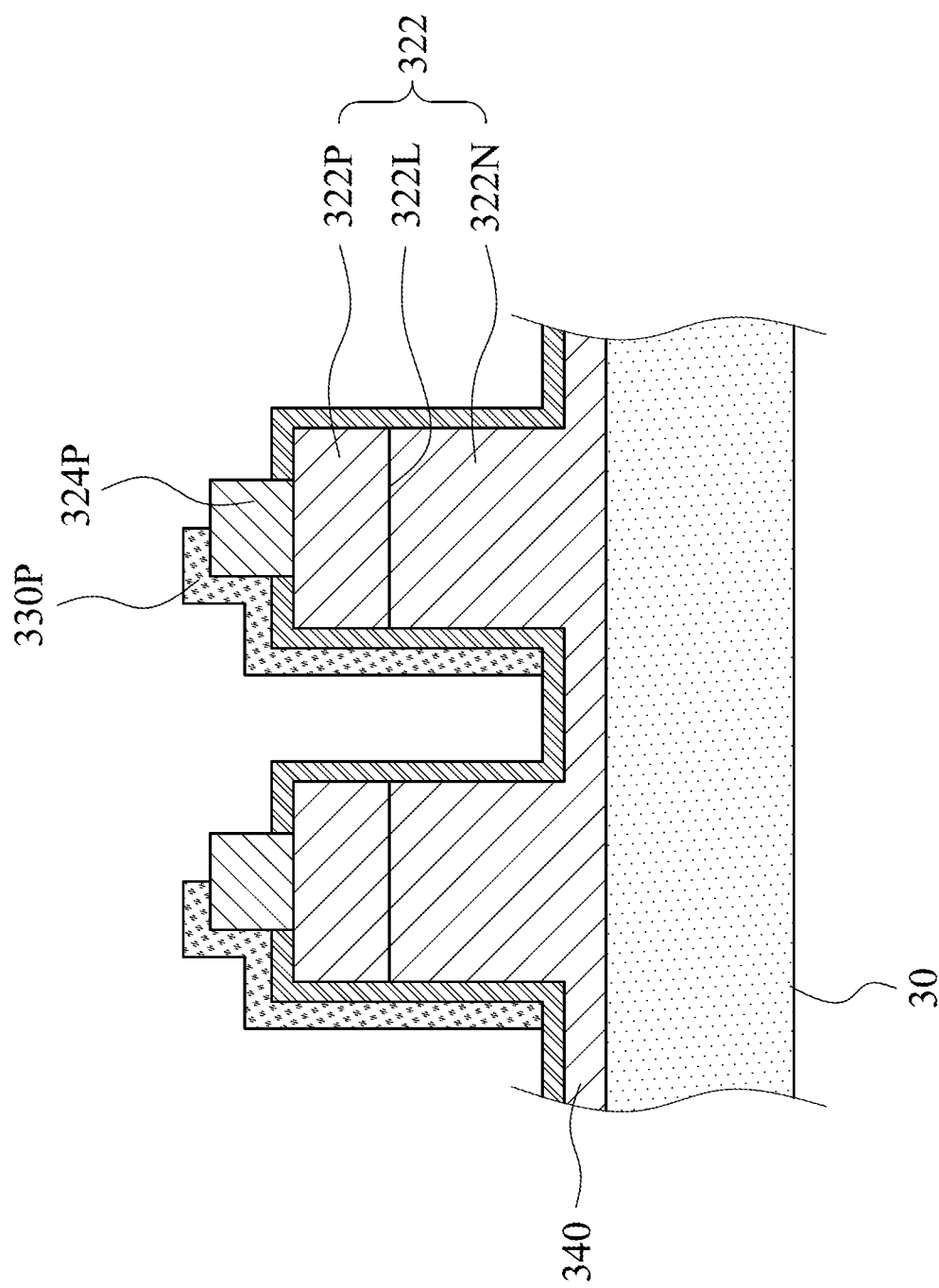
FIG. 10A is a schematic view of a structure of a conductive structure disposing step of the manufacturing method of the micro LED display device of FIG. 9.
Figure 10B:
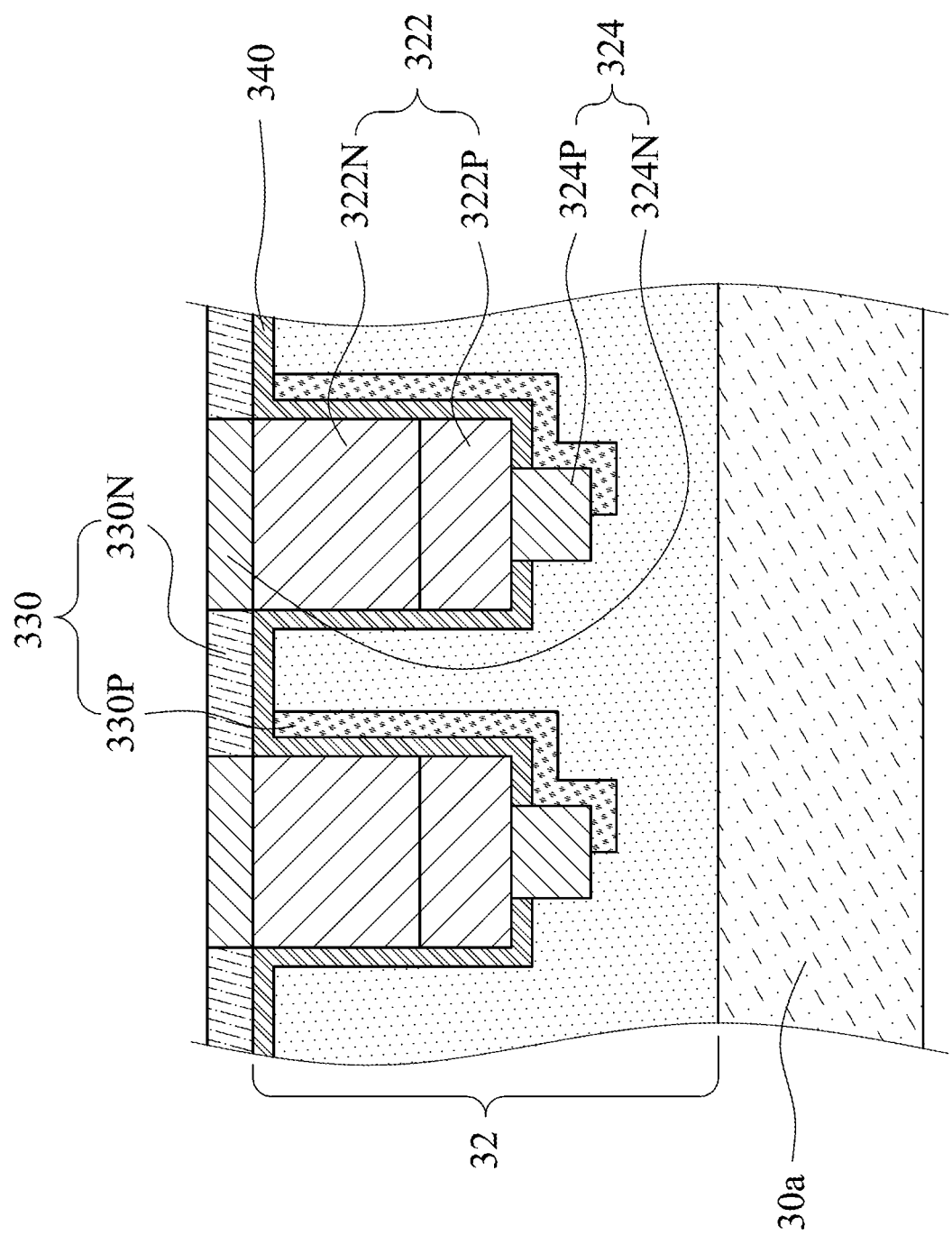
FIG. 10B is a schematic view of a structure of a conductive structure re-disposing step of the manufacturing method of the micro LED display device of FIG. 9.

Please refer to FIG. 9, FIG. 10A and FIG. 10B. FIG. 10A is a schematic view of a structure of the conductive structure disposing step S22 of the manufacturing method 400 of the micro LED display device 300 of FIG. 9. FIG. 10B is a schematic view of a structure of the conductive structure re-disposing step S25 of the manufacturing method 400 of the micro LED display device 300 of FIG. 9. The insulation layer disposing step S21 is performed to dispose the insulation layer 340 on a surface of the semiconductor structure 322. The conductive structure disposing step S22 is performed to dispose the first type conductive layer 330P on the first type electrode 324P. The first transferring step S23 is performed to transfer the micro light emitting unit 32 on a first temporary substrate 30a. The growth substrate removing step S24 is performed to remove the growth substrate 30 of each of the micro light emitting elements 320 from the micro light emitting elements 320, and dispose the second type electrode 324N on the surface of the second type semiconductor layer 322N. The conductive structure re-disposing step S25 is performed to dispose the second type conductive layer 330N on the second type electrode 324N. The substrate disposing step S26 and the color conversion layer disposing step S27 are performed to move the micro light emitting unit 32 in FIG. 10B from the first temporary substrate 30a to the substrate 36, and dispose the color conversion layer 37 on the second type conductive layer 330N. The substrate disposing step S26, the color conversion layer disposing step S27 and the working circuit connecting step S28 are the same as the substrate disposing step S17, the color conversion layer disposing step S15 and the working circuit connecting step S18 in FIG. 3, respectively, and will not be described again. The structure of the micro LED display device 300 in FIG. 8 of the present disclosure can be obtained after the working circuit connecting step S28. In other embodiments, the color conversion layer 37 can be disposed on the second type conductive layer 330N before disposing the micro light emitting elements 320 on the substrate 36.

Figure 11:
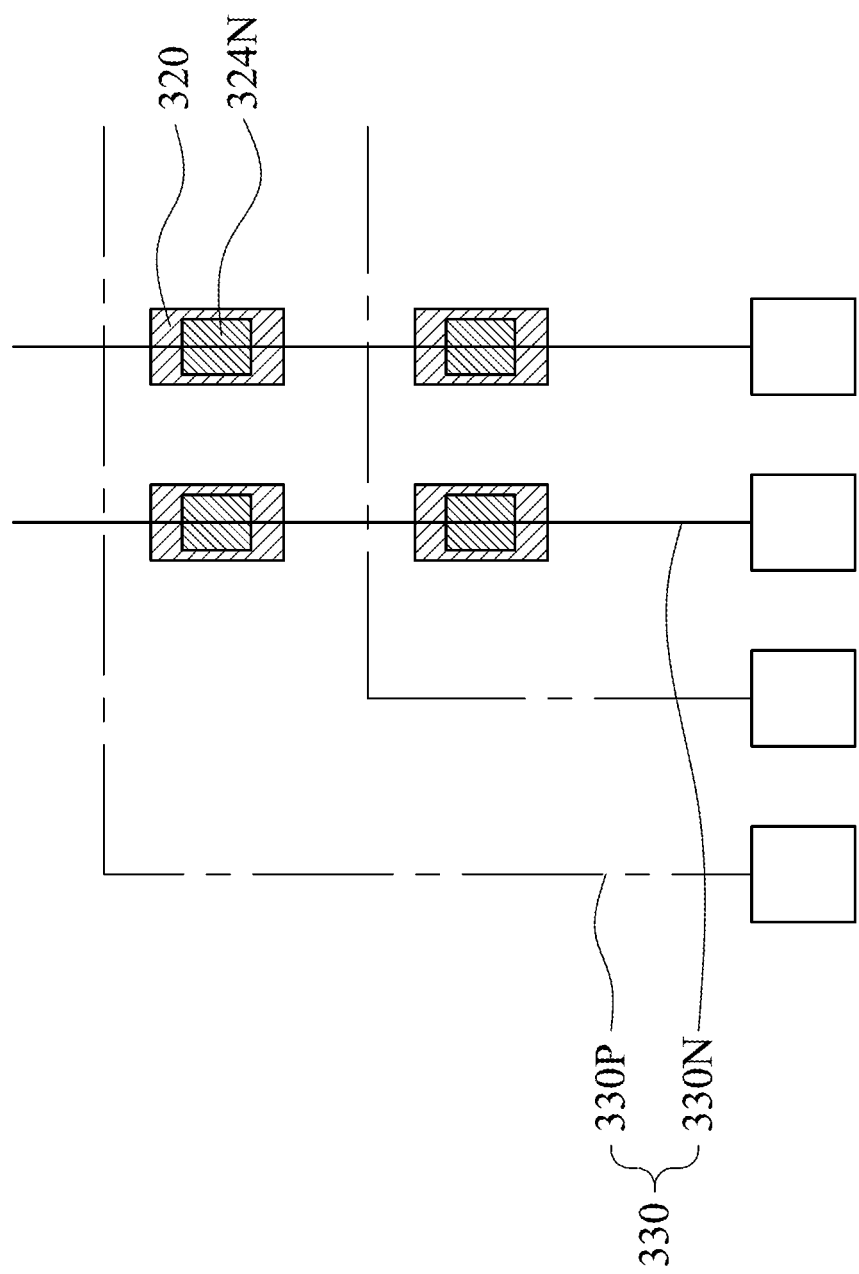
FIG. 11 is a schematic view of a connecting structure of a conductive structure of the micro LED display device of FIG. 8.

FIG. 11 is a schematic view of a connecting structure of the conductive structure 330 of the micro LED display device 400 of FIG. 8. According to the structure of the micro LED display device 300 in FIG. 8, the first type conductive layer 330P and the second type conductive layer 330N overlap between two side of the micro light emitting elements 320, but the first type conductive layer 330P and the second type conductive layer 330N do not intersect each other.

In summary, the micro light emitting elements are fixed with each other via the insulation layer to reduce the damage rate of the micro light emitting elements during the mass transfer process. The micro LED display device of the present disclosure disposes the color conversion layer on the micro light emitting elements, which can emit blue light, before transfer the light emitting elements to the display substrate, to emit red, green and blue light and avoid a problem of a conventional technique of transferring LED wafer with three colors, respectively. The conductive structure is disposed on the micro light emitting elements before transfer can avoid the problem of the micro light emitting elements and the conductive structure cannot be positioning accurately during the mass transfer.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A micro LED display device, comprising:
a micro light emitting unit comprising:
a plurality of micro light emitting elements, wherein each of the micro light emitting elements comprises:
a semiconductor structure comprising a first type semiconductor layer, a light emitting layer and a second type semiconductor layer; and
an electrode structure comprising a first type electrode and a second type electrode, wherein the first type electrode and the second type electrode are electrically connected to the first type semiconductor layer and the second type semiconductor layer, respectively, and the first type electrode has a first surface and a sidewall connected to the first surface;
a conductive structure comprising a first type conductive layer and a second type conductive layer, wherein the first type conductive layer is electrically connected to the first type electrode, wherein the first type conductive layer extends along a sidewall of the second type electrode, a sidewall of the light emitting layer, a sidewall of the first type semiconductor layer, and the first surface and the sidewall of the first type electrode, and wherein the second type conductive layer is electrically connected to the second type electrode;
a substrate, wherein the micro light emitting unit is disposed on the substrate, and the electrode structure is disposed toward the substrate and comprises a gap therebetween;
an isolation layer connected between and in contact with the electrode structure and the substrate; and
an insulation layer on a surface of the semiconductor structure, wherein the insulation layer comprises a bottom portion and a side portion connected to the bottom portion, and the bottom portion and the side portion are disposed between the conductive structure and the semiconductor structure.

2. The micro LED display device of claim 1, further comprising:
a color conversion layer disposed on a side of the micro light emitting unit and configured to convert a color of a light of each of the micro light emitting elements.

3. The micro LED display device of claim 1, wherein the insulation layer is configured to isolate the conductive structure and each of the semiconductor structure.

4. The micro LED display device of claim 1, wherein the micro light emitting elements are fixed with each other via the insulation layer.

5. The micro LED display device of claim 2, wherein the substrate is a display substrate, and the display substrate comprises:
a display area disposed on another side of the micro light emitting unit; and
a non-display area comprising a connector and a working circuit, wherein the working circuit is electrically connected to a control device via the connector.

6. The micro LED display device of claim 1, wherein the isolation layer is connected between the conductive structure and the substrate, and the isolation layer is configured to isolate the conductive structure and the substrate.

7. The micro LED display device of claim 1, wherein the micro light emitting elements are arranged in a matrix, the matrix comprises a plurality of columns and a plurality of rows, and each of the columns is perpendicular to each of the rows.

8. The micro LED display device of claim 7, wherein,
the first type electrodes of a part of the micro light emitting elements arranged in the columns are electrically connected to the first type conductive layer; and
the second type electrodes of a part of the micro light emitting elements arranged in the rows are electrically connected to the second type conductive layer.

9. The micro LED display device of claim 1, wherein the surface of the semiconductor structure comprises a bottom surface and a sidewall connected to the bottom surface, and wherein the bottom portion of the insulation layer is disposed on the bottom surface of the semiconductor structure and the side portion of the insulation layer is disposed on the sidewall of the semiconductor structure.

10. The micro LED display device of claim 1, wherein the first type conductive layer is in contact with the first surface and the sidewall of the first type electrode.

11. The micro LED display device of claim 1, wherein the first type electrode further has a second surface opposite to the first surface, and wherein the first surface of the first type electrode is in contact with the isolation layer and the second surface of the first type electrode is in contact with the first type semiconductor layer.

12. A manufacturing method of a micro LED display device, comprising:
performing an insulation layer disposing step to dispose an insulation layer on a surface of a semiconductor structure of each of a plurality of micro light emitting elements of a micro light emitting unit, wherein the insulation layer comprises a bottom portion and a side portion connected to the bottom portion, wherein each of the micro light emitting elements further comprises an electrode structure comprising a first type electrode and a second type electrode, wherein the first type electrode has a first surface and a sidewall connected to the first surface, and wherein the semiconductor structure comprises a first type semiconductor layer, a light emitting layer and a second type semiconductor layer;
performing a conductive structure disposing step to dispose a conductive structure on the micro light emitting elements of the micro light emitting unit, wherein the bottom portion and the side portion of the insulation layer are disposed between the conductive structure and the semiconductor structure of each of the micro light emitting elements, wherein the conductive structure comprises a first type conductive layer and a second type conductive layer, wherein the first type conductive layer is electrically connected to the first type electrode, wherein the first type conductive layer extends along a sidewall of the second type electrode, a sidewall of the light emitting layer, a sidewall of the first type semiconductor layer, and the first surface and the sidewall of the first type electrode, and wherein the second type conductive layer is electrically connected to the second type electrode;
performing a first transferring step to transfer the micro light emitting unit on a first temporary substrate via an isolation layer; and
performing a substrate disposing step to dispose the micro light emitting unit on a substrate;
wherein the micro light emitting unit is formed by the micro light emitting elements and the conductive structure, and the substrate is disposed toward an electrode structure of each of the micro light emitting elements and comprises a gap therebetween;
and wherein the isolation layer is connected between and in contact with the electrode structure and the substrate.

13. The manufacturing method of the micro LED display device of claim 12, further comprising:
performing a growth substrate removing step to remove a growth substrate of the micro light emitting unit from the micro light emitting elements;
performing a color conversion layer disposing step to dispose a color conversion layer on a side of the micro light emitting unit; and
performing a working circuit connecting step to electrically connect a control device of the substrate with the conductive structure.

14. The manufacturing method of the micro LED display device of claim 13, further comprising:
performing a second transferring step to connect the color conversion layer with a second temporary substrate and remove the first temporary substrate from the micro light emitting unit.

15. The manufacturing method of the micro LED display device of claim 12, wherein the surface of the semiconductor structure of each of the micro light emitting elements comprises a bottom surface and a sidewall connected to the bottom surface, and wherein the bottom portion of the insulation layer is disposed on the bottom surface of the semiconductor structure and the side portion of the insulation layer is disposed on the sidewall of the semiconductor structure.

16. The manufacturing method of the micro LED display device of claim 12, wherein the first type conductive layer is in contact with the first surface and the sidewall of the first type electrode.

17. The manufacturing method of the micro LED display device of claim 12, wherein the first type electrode further has a second surface opposite to the first surface, and wherein the first surface of the first type electrode is in contact with the isolation layer and the second surface of the first type electrode is in contact with the first type semiconductor layer.

* * * * *